(12) United States Patent
Levenson

(10) Patent No.: US 6,287,732 B1
(45) Date of Patent: Sep. 11, 2001

(54) GENERIC PHASE SHIFT MASKS

(76) Inventor: Marc David Levenson, 19868 Bonnie Ridge Way, Saratoga, CA (US) 95070

( * ) Notice: Subject to any disclaimer, the term of this patent is extended or adjusted under 35 U.S.C. 154(b) by 0 days.

(21) Appl. No.: 09/428,308

(22) Filed: Oct. 28, 1999

Related U.S. Application Data

(60) Provisional application No. 60/144,670, filed on Jul. 19, 1999.

(51) Int. Cl.$^7$ ..................................................... G03F 9/00
(52) U.S. Cl. ................................................................ 430/5
(58) Field of Search ............................... 430/5, 322, 323, 430/324; 359/500.22; 716/19, 20, 21

(56) References Cited

U.S. PATENT DOCUMENTS

| | | | |
|---|---|---|---|
| 5,620,816 | 4/1997 | Dao ......................................... | 430/5 |
| 5,807,649 | 9/1998 | Liebmann et al. ....................... | 430/5 |
| 5,882,827 | 3/1999 | Nakao ..................................... | 430/5 |
| 5,935,740 | * 8/1999 | Pierrat .................................... | 430/5 |
| 6,057,063 | 5/2000 | Liebmann et al. ....................... | 430/5 |

OTHER PUBLICATIONS

M. D. Levenson, Phase–Shifting Mask Strategies: Isolated Dark Lines, Microlithography World, Mar./Apr. 1992.

* cited by examiner

Primary Examiner—S. Rosasco
(74) Attorney, Agent, or Firm—Rodney T. Hodgson

(57) ABSTRACT

The fine dark features in the images projected from strong phase-shifting masks used for microdevice lithography are accompanied by 180° shifts in the optical phase, produced by a topography pattern distinct from the pattern of apertures that define the bright features. A generic topography pattern can be formed on the substrate underlying a continuous opaque mask layer which subsequently is patterned with a device-specific array of apertures. When the image projected from a phase-shifting mask comprised of the generic topography pattern and the device-specific aperture pattern is combined with a device-specific image projected from an associated conventional photomask, the photoresist pattern that results corresponds to desired device layers with the imaging advantages of strong phase-shifting masks, but without the need for specific patterning of the topography pattern.

28 Claims, 9 Drawing Sheets

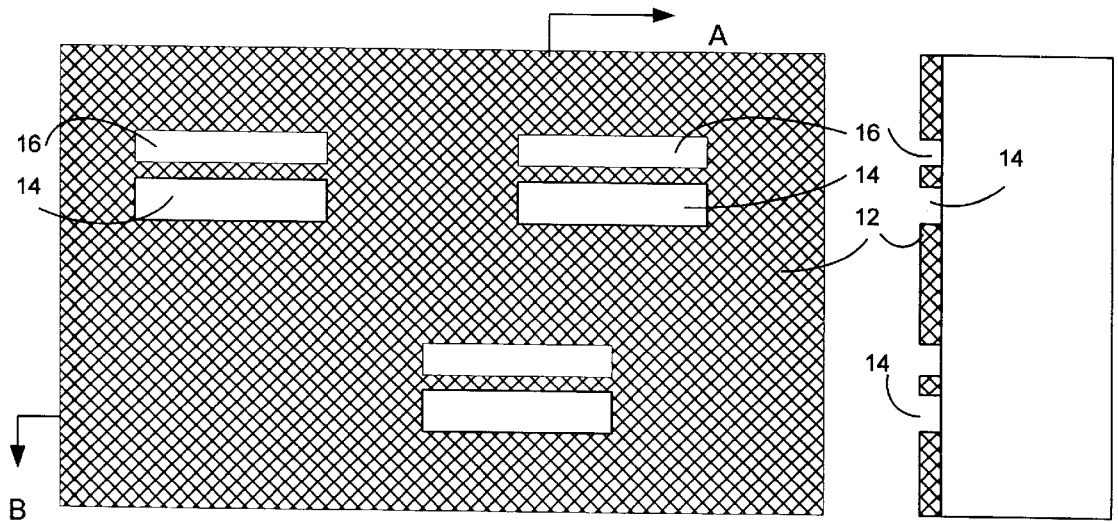
Fig. 1A Prior Art
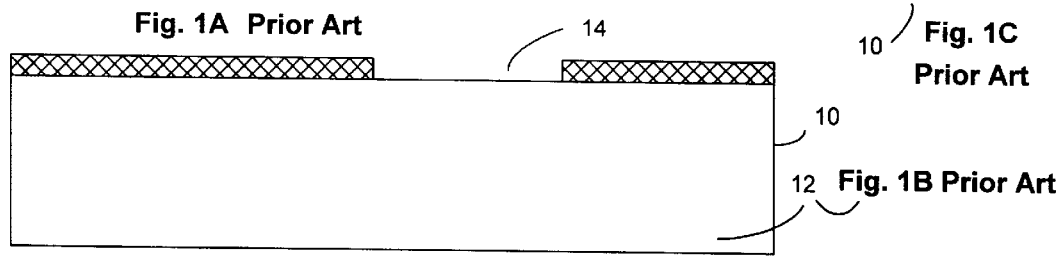
Fig. 1C Prior Art
Fig. 1B Prior Art
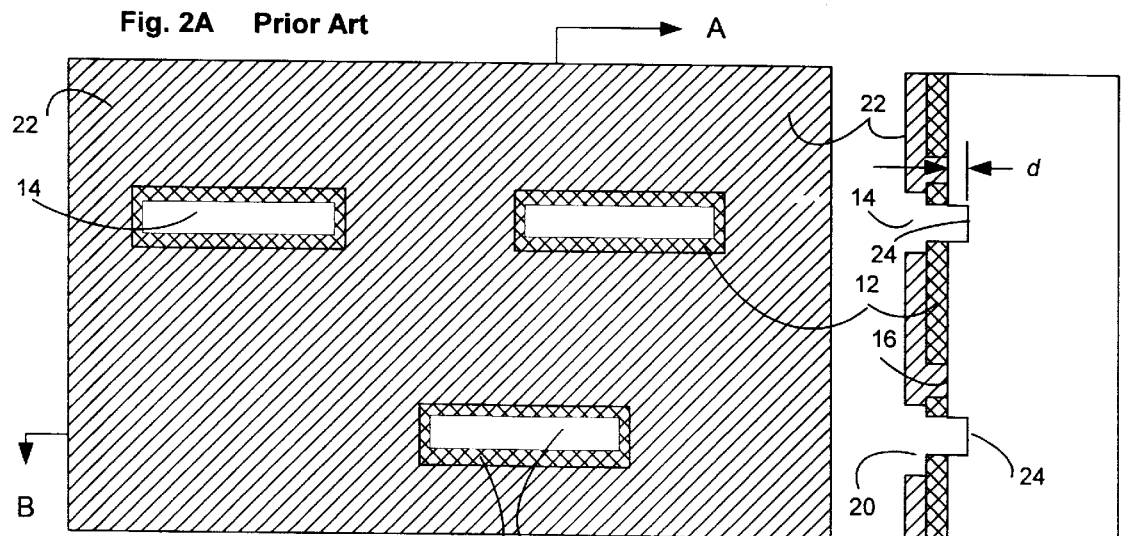
Fig. 2A Prior Art
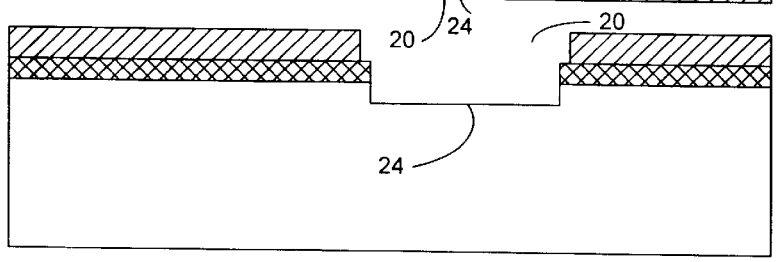
Fig. 2C Prior Art
Fig. 2B Prior Art

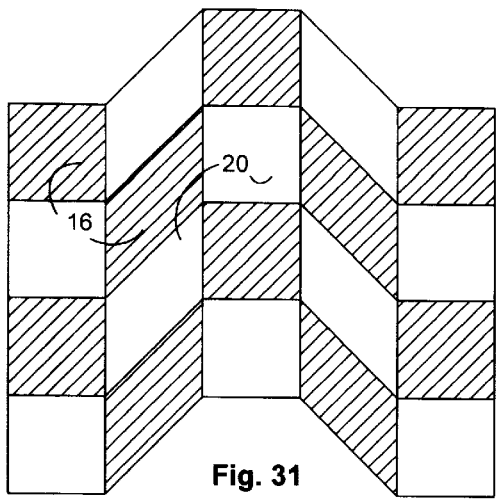
Fig. 31
Fig. 32
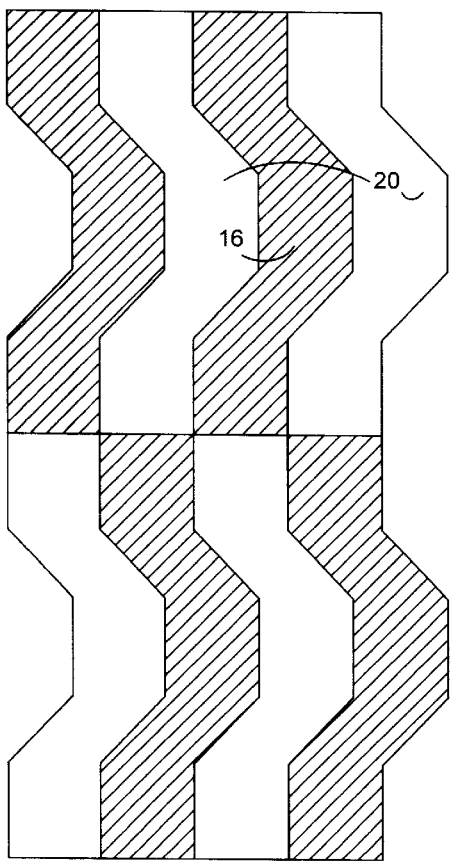
Fig. 33
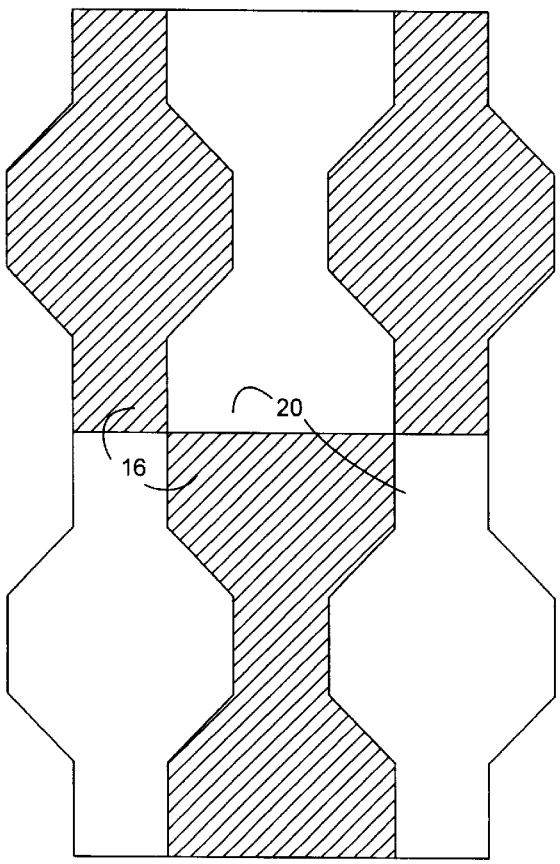

GENERIC PHASE SHIFT MASKS

CROSS REFERENCE TO RELATED APPLICATIONS

This application claims priority pursuant to 35 U.S.C. 119(e) to U.S. Provisional Application No. 60/144,670 filed Jul. 19, 1999, and is related to an application entitled Generic Phase shift Masks, by the inventor of the present application, which was filed on the same date as the present application. All of the above applications are incorporated herein by reference in their entirety including incorporated material.

FIELD OF THE INVENTION

The field of the invention is the field of lithography, and particularly photolithography for use in semiconductor, magnetic recording, and micromachining applications.

BACKGROUND OF THE INVENTION

Photolithography

This invention relates to the field of microlithography for the manufacture of integrated circuits, magnetic devices, and other microdevices such as micromachines. In this field the final product is manufactured in sequential manner in which various patterns are first produced in a "resist" material with each pattern subsequently defining a product attribute. The "resist" materials, generally polymer compositions, are sensitive to light or other forms of radiation. The patterns are formed in the resist by exposing different regions of the resist material to different radiation doses. In the bright (high dose) regions, chemical changes take place in the resist that cause it to dissolve more easily (for positive resists) or less easily (negative resists) than in dim (low dose) regions. The bright and dim regions are formed using an exposure tool which generally transfers corresponding features to the resist from a mask or reticle. The masks or reticles are formed from mask blanks, which are plates of quartz coated with an opaque material such as chrome. The chrome is etched away in a pattern to form the mask. The radiation employed may be (but is not limited to) ultraviolet light and x-rays, and the regions of the mask that are opaque and transparent form a pattern of bright and dark when illuminated uniformly. In the most common implementation of this technology, a projection lens forms an image of the mask pattern in the resist film on a planar substrate. That image comprises the high and low dose regions that produce the resist pattern. When some form of light is employed in this process, it is called photolithography.

Wavefront Engineering

The patterns formed in the resist are not identical to those on the mask, and the methods of obtaining the pattern desired for the ultimate manufactured device in spite of deficiencies in the microlithography process is called "wavefront engineering." Among the various devices used for this purpose are phase shifting masks (PSM)s-which create desired dark regions though interference. Phase shift masks were first published by the inventor of the present invention in a paper entitled "Improving resolution in photolithography with a phase shifting mask," M. D. Levenson, N. S. Viswanathan, and R. A. Simpson, IEEE Trans. Electron Devices ED-29, 1828–1836 (1982). Since that time, there have been hundreds of patents and thousands of papers issued containing the phrase "phase shift mask". However, the technology is presently used only in applications such as memory chips and microprocessor chips. The inventor of the present invention has realized that the design and construction of the required lithography masks is so expensive that the investment required can not be returned on a few hundred or thousands of wafers. The present invention shows a way to produce phase shift masks in a cost-effective way, so that the same phase shift mask substrate design may be used with many different device designs by trading off maximum density of features on a device with cost for low volume runs.

There are presently two types of PSMs in use: weak-PSMs such as the Attenuated-PSM and strong-PSMs such as the Alternating-Aperture-PSM. These two differ in that the weak-PSMs have only one type of bright feature, while the strong-PSMs contain two types of bright features identical except for the optical phase, which differs by ~180°. See, for example, M. Shibuya, Japanese Patent Showa 62-50811, M. D. Levenson et. al. IEEE Trans. Elect. Dev. ED-29, 1828–1836 (1982), and M. D. Levenson, Microlithograpy World 6–12 (March/April 1992).

Alternating Aperture PSMs

"FIGS. 1(A–C) shows plan, side elevation (along cut A), and end elevation (along cut B) views of the result of steps in construction of an alternating aperture PSM as currently implemented commercially. A substrate 10 is made of a material such as a fused quartz plate or other stable material which must be transparent to the light used in the photolithography for a transmission mask. The substrate 10 is coated with an opaque ("chrome") film 12 in which openings 14 and 16 have bee opened by normal photoresist application, exposure, and development, followed by chrome etch, to form a conventional chrome-on-glass (COG) photomask. After stripping the original photoresist, the photomask is then recoated with a resist film (hatched areas 22 of FIGS. 2(A–C)) and apertures 20 are opened in the resist film at the locations of apertures 14 which will be phase-shifted. The openings in this second resist film are larger an those in the underlying chrome to accommodate possible mis-registration. The photomask is then etched and the chrome 12 exposed in the resist openings is used as a mask to etch the underlying substrate 10 to a depth d below the original surface to make depressions 24 as shown in the view of FIGS. 2(A–C) taken after etching of the substrate 10. The depth d of the features 24 etched in the substrate 10 is carefully chosen in on the basis of the wavelength of the light to be used in the photolithography and the difference in the index of refraction of the material of the substrate and the ambient atmosphere in which the phase shift mask is used."

A plan view of the etched substrate 10 of FIG. 2A with the chrome removed is shown in FIG. 3 where the hatched areas 32 correspond to the etched phase-shifted apertures 24 in FIG. 2. The substrate 10 etched and patterned as shown in FIG. 2 defines a small part of a phase shift mask used to produce patterns in a photoresist. The difference in phase velocities of radiation in the air and in the substrate 10 material produces a 180° phase shift in the light passing through regions 16 and regions 20 of the phase shift mask shown in FIGS. 2(A–C), (with photoresist removed), which result in destructive interference and which cancels the light amplitude in the region between regions 16 and 24. The term "alternating aperture-PSM" refers to the fact that the transparent apertures on opposite sides of a dark line have alternate (0°–180°) phases. The alternation in phase between otherwise identical apertures doubles the period of the optical amplitude pattern which corresponds to a given intensity pattern. Thus, that a given projection exposure tool can create resist patterns smaller by a factor of 2 (or more) when using an alternating aperture PSM, and dramatically increase the depth of focus. In particular, robust isolated dark lines characteristic of transistor gates can be made 3× thinner, dramatically increasing circuit speed.

"FIG. 4 shows the pattern of exposed photoresist 44 and unexposed photoresist 42 resulting when light passes through the regions 16 and 20 of the mask of FIG. 2. The pattern shown in FIG. 4 is typically 4 or 5 times smaller than the pattern of the mask shown in FIG. 2A. The width 40 of the exposed areas of the photoresist is typically greater than the wavelength of the light used for exposure."

In known art, the pattern of phase-shifting is different from that of the open (non phase shifted) apertures and must be customized for each mask of each product. Such masks require multiple customized patterns to be written on each mask substrate.

In order to ensure that the two types of aperture perform identically in an optical sense, except for the phase-shift, the substrate of the prior art may or may not be etched back laterally under the opaque film as shown in FIG. 5, thus possibly leaving the opaque film unsupported at the edge 50. The non phase shift apertures 52 and 54 and the phase shift apertures 58 are noted. The trenches 56 and 58 etched in the substrate beneath the apertures are necessarily formed after the apertures are etched in the opaque layer, which is a high-cost process. The requirement to form a second custom pattern—by a process that can result in uncorrectable defects—significantly raises the cost of producing alternating aperture-PSMs. The design cost is also larger than for conventional masks as at least two mask patterns (one for brightness and one for phase) must be designed and checked for each circuit level.

U.S. Pat. No. 5,807,649 teaches a double exposure system for exposing a photoresist using a phase shift mask and with a second mask to expose unwanted dark areas left by the phase shift mask.

U.S. Pat. No. 5,620,816 teaches a double exposure system where a chromeless phase-edge shift mask is used to expose all of the photoresist except on lines running in rows and/or columns, and then a customized mask is used to expose unwanted portions of the lines and/or columns. The chromeless phase shift mask method is deficient in that the width of the unexposed lines can not be controlled, and that the unexposed lines are not totally unexposed as is shown by the 4.69% (of presumed flood exposure) shown. Chromeless masks typically have a minimum exposure in the phase shift areas of 10% or more. This problem is worsened as the masks and optics accumulate dirt in the real world of manufacturing. The chromeless mask is also deficient in that defects in the etched and non etched areas generally may not be repaired. The chromeless mask is deficient in that the exposure region where two or four chips meet on the wafer is typically overexposed by a factor two or four and the resist "blows out" for a region about these areas. The chromeless mask of the above patent is deficient in that the crossing lines left unexposed may degrade device performance. Finally, the chromeless mask of the U.S. Pat. No. 5,620,816 may only be used to define a set of lines, and not of features typically needed in lithographic patterns. The phase shift mask of the above identified patent is suited to double expose a series of perpendicular lines using the same or a similar mask rotated, and then to further expose some of the unexposed array of points to make a contact pattern.

PSM Design

Various Electronic Design Automation (EDA) tools are known for preparing the patterns used in conventional and phase-shifting masks. In addition, OPC tools alter those patterns to account for the realities of the exposure systems. It is also known that the pattern of apertures on the phase-shifting mask need not correspond closely to the ultimate circuit pattern, at least not when a conventional block-out mask is employed for a second exposure on the resist film in concert with is a first exposure made using an alternating-aperture PSM. Such second exposures erase anomalies due to phase-conflicts. Numerical Technologies, Inc., in U.S. Pat. No. 5,858,580, in particular, has demonstrated the In-Phase design system which employs a block-out mask similar in geometry to the ultimate circuit feature along with an alternating-aperture PSM composed of pairs of small apertures (shifters), one of which has 0° phase, while the other has 180°-which define the narrowest dark features between them.

ASIC Applications of PSMs

Application-specific integrated circuits (ASICs) are typically made in too small production runs to support the extra cost of a PSM that requires two patterning steps. Other methods of wavefront engineering have been suggested to help shrink the circuit dimensions for these devices. However, none of them permit such narrow gate-like features as the alternating aperture-PSM. That may mean that the speed of low-volume ASICs will soon fall below that of DRAMs and mass-produced microprocessors, which can support the cost of advanced mask technology.

However, many ASIC chips have relatively low density, since the overall size of the chip is constrained by the need for sufficient input/output pads. The present invention is a method of patterning alternating-aperture phase-shifting masks for low density circuits which realizes the full advantage of previous PSM techniques, while dramatically reducing costs. It is especially suitable for ASICs, but may also be useful for larger-volume circuits.

OBJECTS OF THE INVENTION

It is an object of the invention to provide a method, an apparatus, and a system for phase shift lithography which dramatically lowers costs for strong phase shift masks.

It is an object of the invention to provide a method, an apparatus, and a system for phase shift lithography which enables automatic design of lithography mask sets.

SUMMARY OF THE INVENTION

Generic phase shift mask blanks for lithography are provided, whereby unexposed areas of minimal and controlled dimensions are enabled at known locations in photoresist exposed using a generic phase shift mask blank together with personalization of the generic phase shift mask blank. Double exposure with a second conventional photomask produces a conventional pattern in the photoresist, where the fine line features of the unexposed photoresist are located at positions dictated by the generic phase shift mask blank.

Methods of and systems for designing, producing, and using phase shift masks made from such phase shift mask blanks are described.

Regular arrays of topographic features useful in generic phase shift mask production are introduced.

BRIEF DESCRIPTION OF THE DRAWINGS

FIGS. 1 (A–C) shows a plan, side elevation, and end elevation result of steps in construction of an prior art alternating aperture phase shift mask (PSM).

FIGS. 2 (A–C) shows a prior art PSM.

FIG. 31 shows a plan view of a generic substrate.

FIG. 32 shows a plan view of a generic substrate.

FIG. 33 shows a plan view of a generic substrate.

DETAILED DESCRIPTION OF THE INVENTION

Figures 3A, 3B:
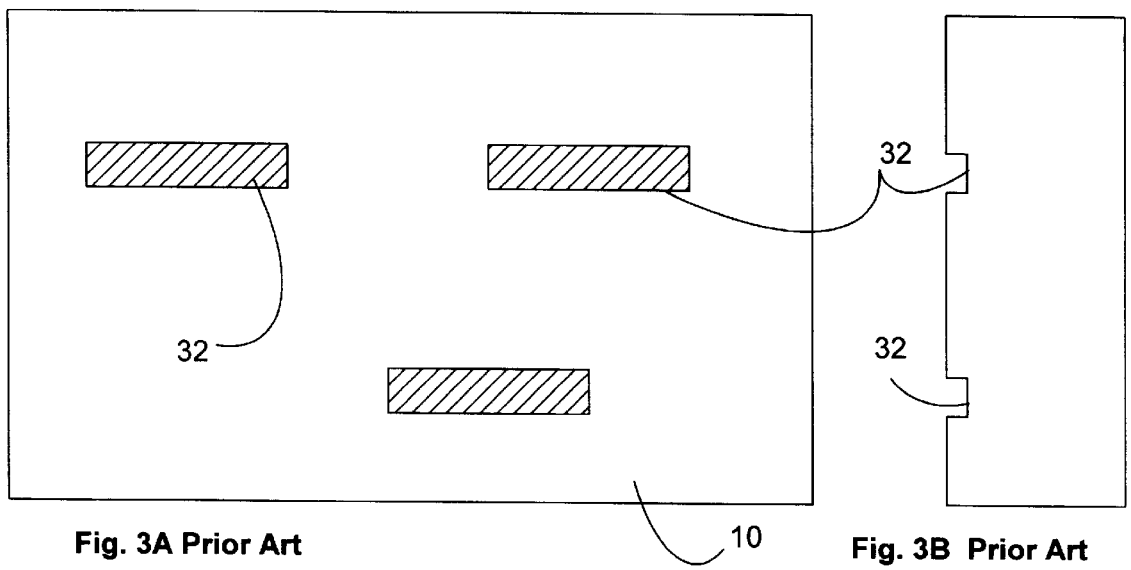
FIGS. 3 (A–B) show plan and elevation views of the substrate of FIG. 2.
Figure 4:
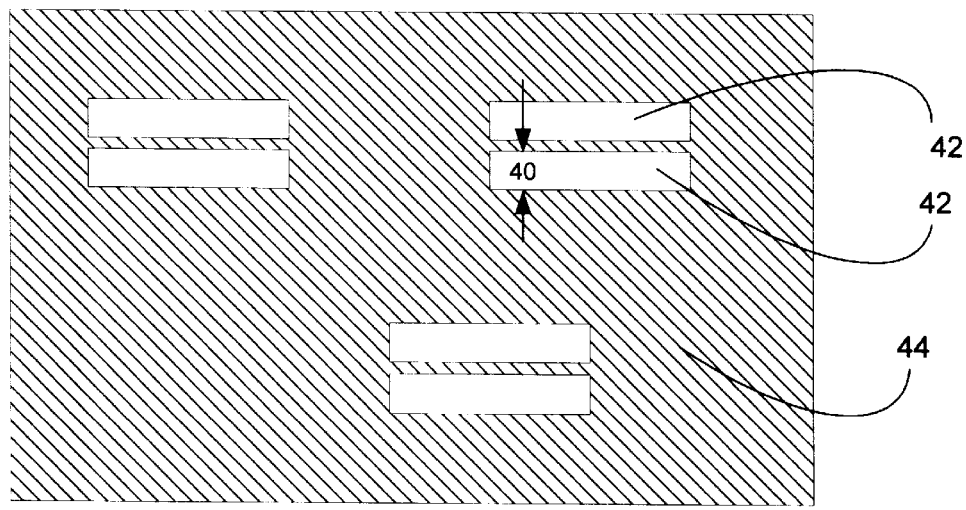
FIG. 4 shows an exposure pattern of the PSM of FIG. 2.
Figure 5:
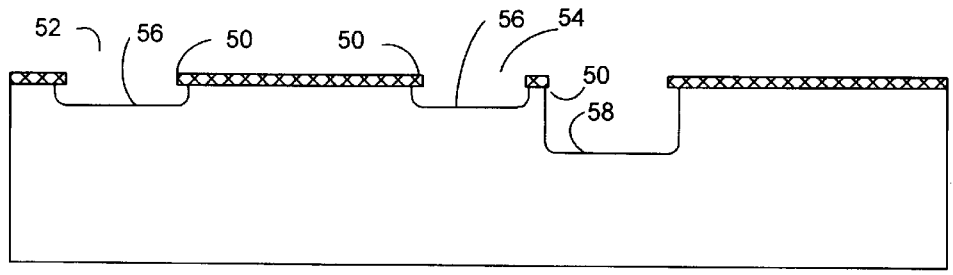
FIG. 5 shows an elevation view of a prior art PSM.

The invention is a generic phase shift mask blank and the method of designing a device, patterning the phase shift mask, and a system for producing a device using the patterned phase shift mask. The phase shift mask blank consists of a substrate with an array of phase shift areas produced in the surface of the substrate, and a covering or film of opaque material covering substantially all of the phase shifting areas of the mask as is shown in partial cross section in FIG. 6. A generic phase shift mask substrate 60 is shown covered with an opaque film 62. Areas of 0° and 180° phase shift 16 and 20 are shown. Potentially opaque registration marks (not shown) in registration with the boundaries between the 0° and 180° phase areas may be located as needed on the mask, most preferably around the periphery of the mask. In addition, registration marks may be etched in the opaque film at the same time that apertures are opened in the opaque film as will be described later.

"Since production of a prior art phase shift mask is too expensive for short production runs, the inventor proposes production of a large quantity of generic substrates from a single design which may be suited to very many particular uses. When coated with a continuous opaque film, such generic substrates form a generic phase shift mask blank. A genexic substrate is produced having patterns such as shown cross section in FIG. 6, and in different embodiments as possible plan views 7–9, 27, and 31–33. The entire substrate surface of the mask area way be covered by such uniform arrays of areas 16 and 20 which have phase shifts for light approximately (within 20°) 0° and 180° respectively, or a plurality of different arrays may be placed in different areas of the mask corresponding to different requirement of feature density of the device being manufactured. In the most preferred embodiments, the features form a regular array or arrays, but irregular sets of features may be used for some particular purposes. (The area of the phase shift mask is here defined as the area which corresponds to the device being manufactured, and does not include the periphery of the mask or the edges of the substrate plate necessary for the mask be held in the exposure tool or for the mask to have a standard size.) The generic phase shift mask blank then defines the possible position of small features to be produced with generic phase shift mask technology, and the placement of particular features is determined by recording the positions of the boundaries of the adjacent phase shift areas, and designing or adjusting the design of the device accordingly."

The generic phase shift mask blank substrates may be produced with standard photoresist exposure, development, and etch procedures using quartz plates, or may be produced in an inventive embodiment by molding or stamping of materials such as sol gel materials, xerogel materials, metals, or polymer materials, as shown in T. Ramos et al., Proc. of Dielectrics for ULSI Multilevel Interconnection Conference, PP106–113, (1997). It is known in the art of compact disk production that a particular feature is reproduced in polycarbonate material with resolution under 10 nm. Stamping or molding the generic substrate cuts the cost of such substrates enormously. In particular, masks for soft x-ray phase shift lithography which are reflection masks could use the embossed substrates of metal or polymer which are not transparent to short wavelength radiation.

Figure 7:
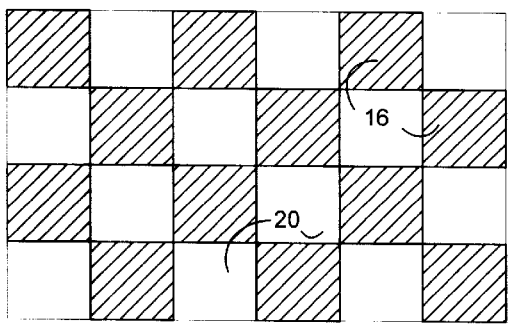
FIG. 7 shows a preferred embodiment of the generic substrate of the invention.
Figure 8:
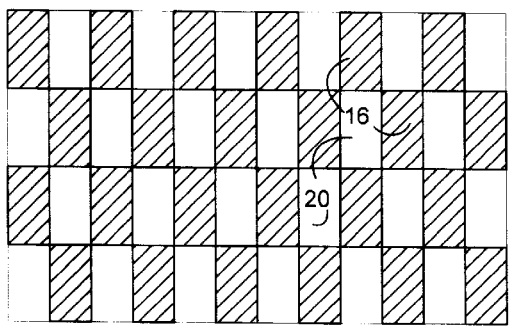
FIG. 8 shows a preferred embodiment of the generic substrate of the invention.
Figure 9:
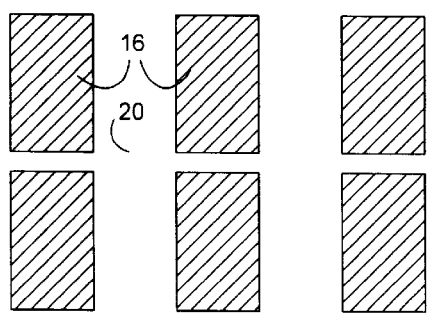
FIG. 9 shows a preferred embodiment of the generic substrate of the invention.
Figure 10:
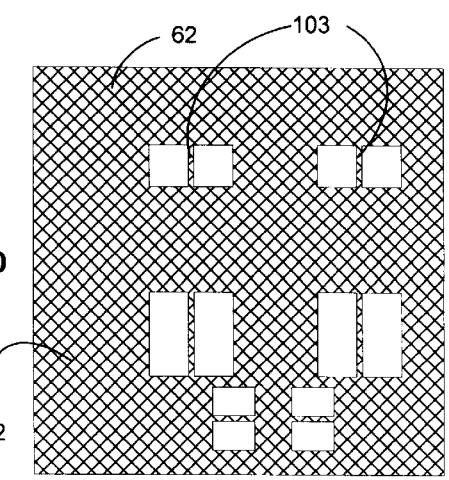
FIG. 10 shows a patterned opaque layer of the generic PSM of the invention.
Figure 11:
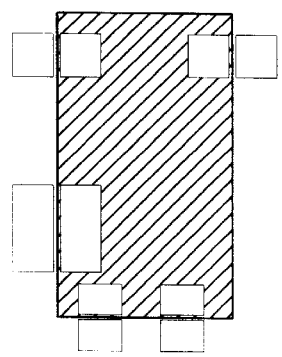
FIG. 11 shows the registration of the pattern of FIG. 10 with respect to a feature of FIG. 9.
Figure 12:
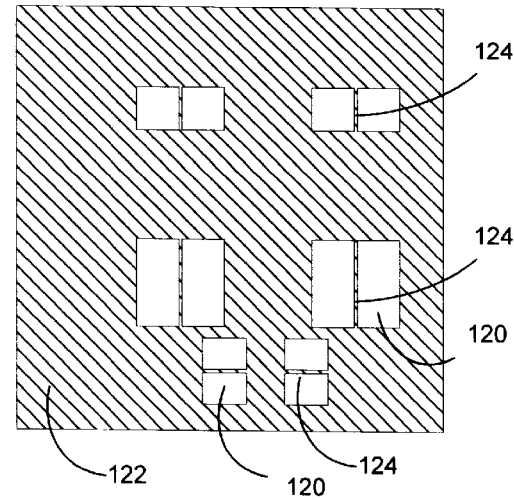
FIG. 12 shows an exposure pattern of the PSM of FIG. 10.

An embodiment of the use of a generic phase shift mask is shown in the series of figures starting with one of the phase shift masks having patterns such as shown in FIGS. 7–9, and opening apertures in the film 62 in the pattern 102 having narrow lines 103 shown in FIG. 10. The narrow opaque lines 103 overlay the edge separating the phase shift areas 16 and 20. One of the areas 16 of FIG. 9 is shown in FIG. 11 to show the overlap between pattern 102 and one of the areas 16 of FIG. 9. Note that a corresponding pattern of line edges may be produced using the patterns of FIG. 7 and FIG. 8 also. When the generic phase shift mask blank with the personalized pattern 102 opened in the opaque film 62 is used to expose photoresist in a step of manufacturing a device, the exposed photoresist is shown by the open areas 120 of FIG. 12 in the middle of the unexposed areas 122.

Figure 13:
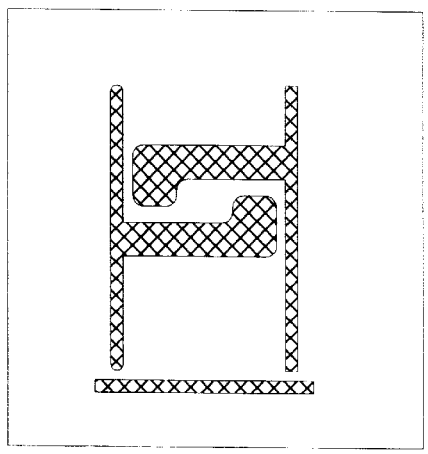
FIG. 13 shows a non phase shift mask opaque pattern.
Figure 14:
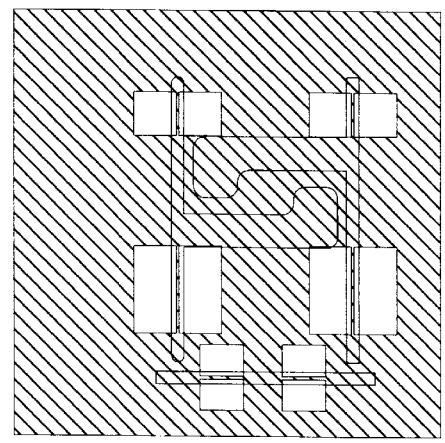
FIG. 14 shows the registration of the projected pattern of FIG. 13 and FIG. 10.
Figure 15:
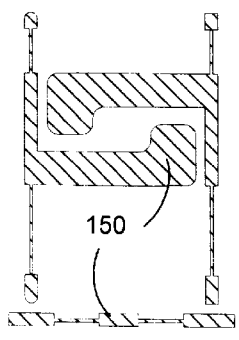
FIG. 15 shows the exposure pattern of a double exposure patterns of FIG. 13 and FIG. 10.
Figure 16:
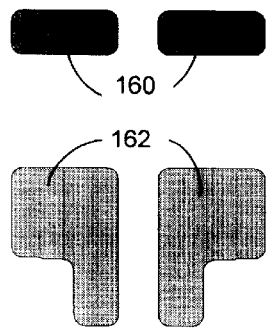
FIG. 16 shows the pattern of active areas of a silicon device.
Figure 17:
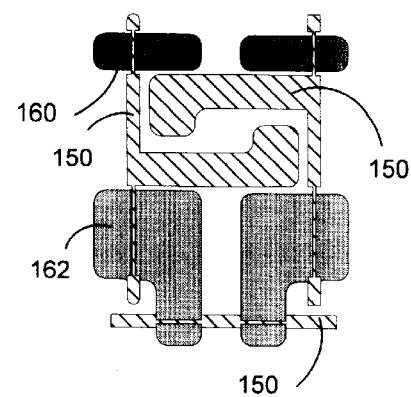
FIG. 17 shows the registration of the patterns of FIGS. 15 and 16.

The fine line features 124 left by the results of the phase shift are also depicted. A second exposure with a conventional photomask shown in FIG. 13 registered with respect to the pattern 102 as shown in FIG. 14 leaves a pattern of unexposed photoresist 150 shown in FIG. 15. If the underlying active areas 160 and 162 of a device such as a silicon device are as shown in FIG. 16, the unexposed photoresist will appear in registration with the active areas as shown in FIG. 17.

Figure 6:
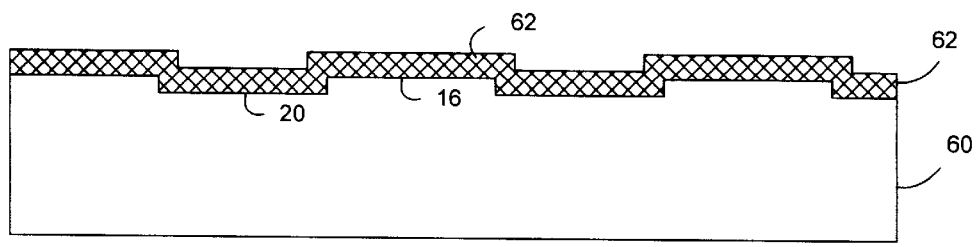
FIG. 6 shows an elevation view of the PSM of the invention.
Figure 18:
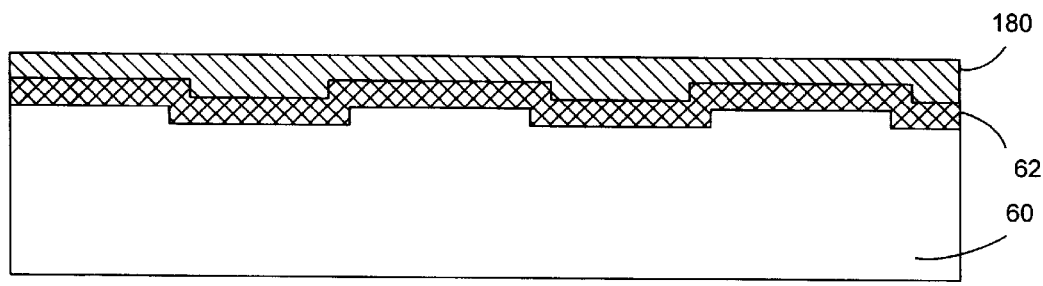
FIG. 18 shows the PSM of FIG. 6 covered with photoresist.
Figure 19:
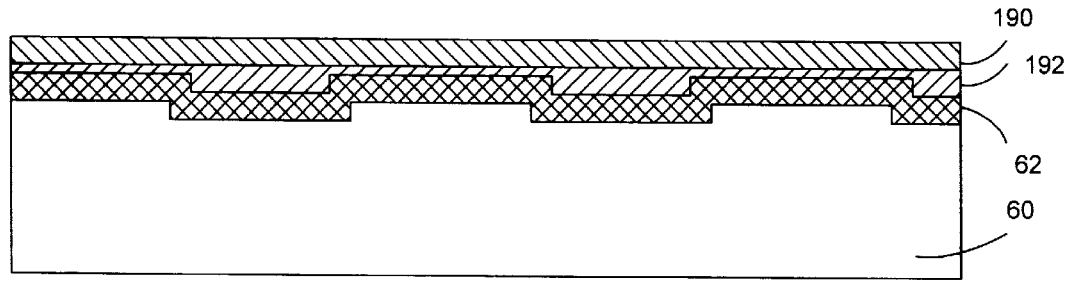
FIG. 19 shows the PSM of FIG. 6 covered with two layer photoresist.
Figure 20:
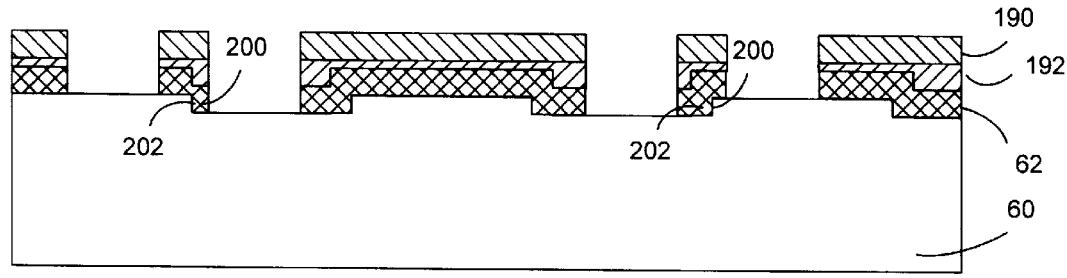
FIG. 20 shows the PSM of FIG. 19 exposed, developed, and etched.
Figure 21:
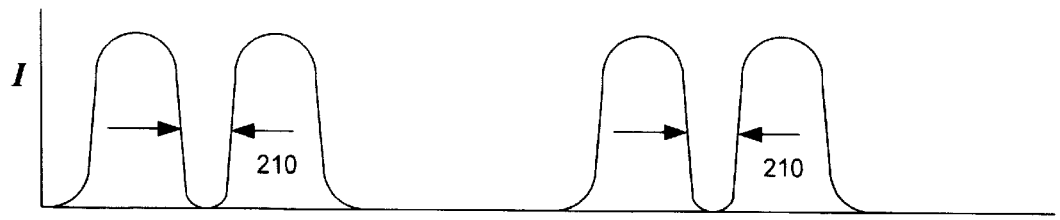
FIG. 21 shows the intensity of light falling on photoresist exposed through the PSM of FIG. 20.

A preferred embodiment of the invention is shown in FIGS. 18–20, where the generic mask of FIG. 6 is coated with an optical or e-beam resist 180 which may be in two layers 190 and 192 as shown in FIG. 19. The resist is exposed and developed as shown in FIG. 20, and the chrome layer 62 is etched. After the photoresist 190 and 192 is stripped from the etched mask shown in FIG. 20, and the mask is used to expose photoresist on a product wafer, the exposure intensity I is shown as a function of distance in FIG. 21. Leaving chrome 200 on the phase mask edge 202 and adjusting the width w of the chrome line shown on FIG. 20 allows control of the line width 210 produced by the generic phase shift mask on a product wafer photoresist as shown in FIG. 21, acts to darken the line over that achievable with a phase edge chromeless mask, and registers the line more accurately with respect to features exposed by the personalized generic phase shift mask. The intensity of exposure under the chrome line 200 is preferably less than 5%, more preferably less than 4%, and most preferably less than 2% of the flood exposure level.

Figure 22:
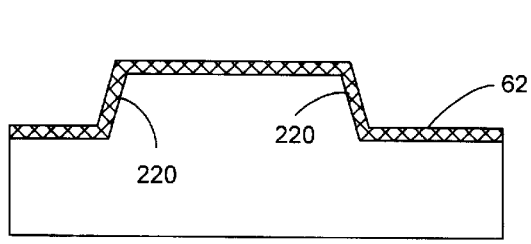
FIG. 22 shows a preferred embodiment of a PSM blank.

An even more preferred inventive embodiment of the invention is to produce the generic phase shift mask substrate with sloping sidewalls 220 between the flat areas as shown in FIG. 22. The angle of the sidewall with respect to the surface of the substrate is preferably near 70°, but may be steeper or shallower as required by the molding, stamping, or etching processes used.

Figure 23:
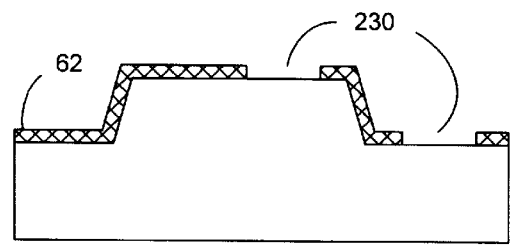
FIG. 23 shows the personalized PSM blank of FIG. 22.

When apertures 230 are opened in the film 62, the portion of the personalized phase shift mask blank shown in FIG. 23 results.

The cost per wafer exposed of the phase shift mask is further reduced in an inventive process whereby a generic phase shift mask blank may be personalized and used for a series of exposures, and when the run is finished and the mask is no longer needed, the chrome may be stripped off and the generic substrate recoated with a fresh film of chrome and personalized for use in further exposures with a different pattern.

In the above figures, the thickness of the opaque film in relation to the height of the phase shift areas is shown much enhanced for clarity, as are the feature heights of the phase shift masks in relation to the thicknesses of the substrates. The dimensions of the phase shift areas shown in FIGS. 6–9 are large enough to avoid producing dark lines with crossing dark lines which would be left unexposed if corners of the rectangular areas shown in FIGS. 6–9 were not covered by the opaque film. Patterns with such smaller dimensions may be used in some embodiments of the invention.

Figure 24:
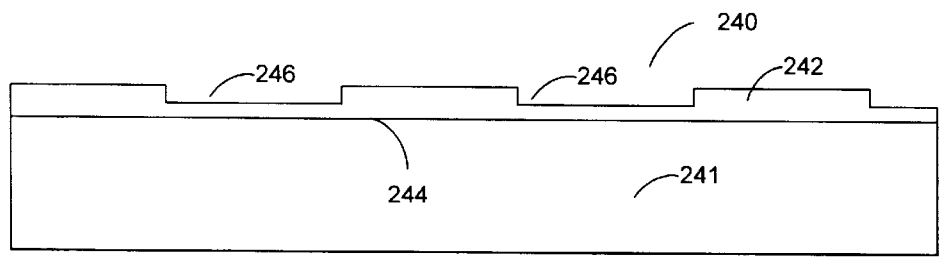
FIG. 24 shows a preferred embodiment of a generic substrate.

FIG. 24 shows a preferred embodiment of the invention, wherein the generic substrate 240 of the generic phase shift mask blank is shown as a plate 241 of a first material with another material 242 attached to the surface 244 of the plate 241. The phase shift pattern 246 is formed in the material 242 by stamping, molding, or etching.

Figure 25:
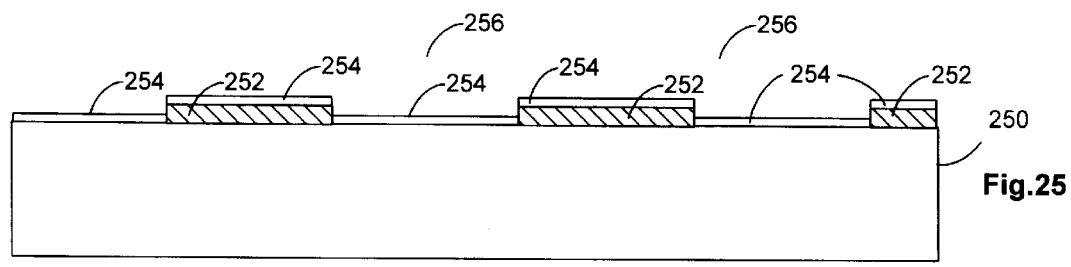
FIG. 25 shows a preferred embodiment of a generic substrate.

FIG. 25 shows a picture of construction of a generic substrate for a generic phase shift mask blank, whereby a flat plate 250 is covered with exposed and developed photoresist 252, and phase shift material 254 is deposited on the flat plate in the phase shift areas 256. Such deposition systems as plasma deposition, CVD deposition, and other deposition systems are known in the art. Dissolving the resist 252 lifts off the material 254 deposited on top of the resist, and leaves material 254 in the phase shift areas 256.

Figure 26:
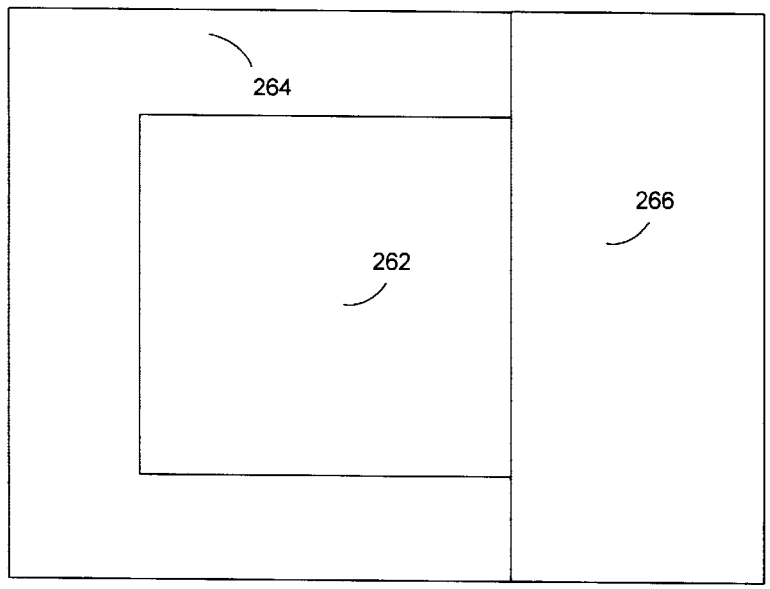
FIG. 26 shows a plan view of a generic phase shift mask blank.

FIG. 26 shows a plan view of a generic phase shift mask blank 250 having three areas 262, 264, and 266. Each of the areas 262, 264, and 266 may have a different uniform array of phase shift areas to accommodate different requirements for feature density and feature orientation.

Figure 27:
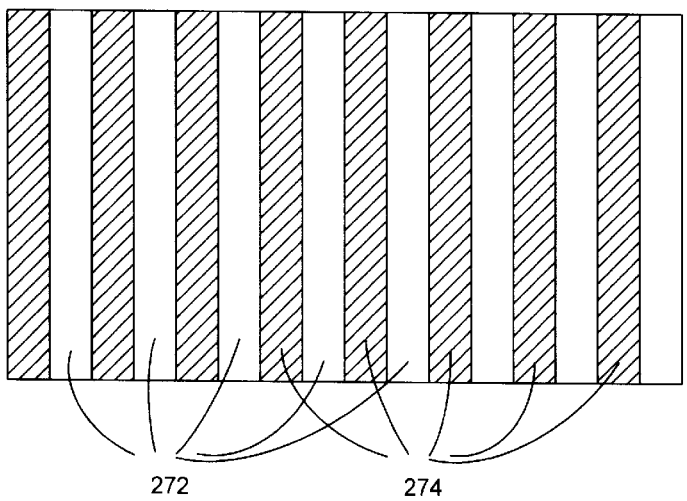
FIG. 27 shows a plan view of a generic substrate.
Figure 28:
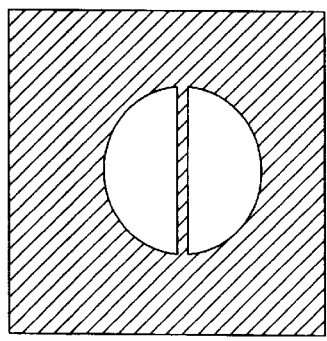
FIG. 28 shows a plan view of an exposure pattern.
Figure 29:
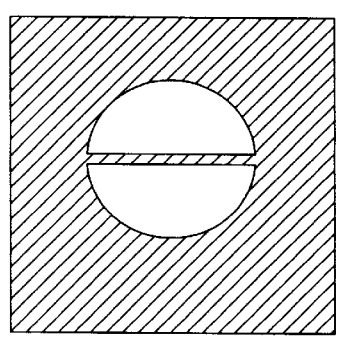
FIG. 29 shows a plan view of an exposure pattern at right angles to FIG. 28.
Figure 30:
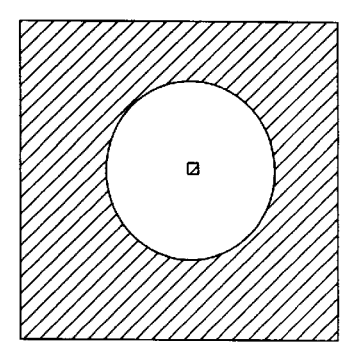
FIG. 30 shows a plan view of a double exposure pattern of FIGS. 28 and 29.

The embodiments of generic phase shift mask substrates shown in FIGS. 6–9 may be extended to cover stripes of alternating phase shift 272 and 274 of FIG. 27 which would produce unexposed lines running in only one direction. Unexposed areas in photoresist suitable for contact holes may be formed by a double exposure using two phase shift masks produced from generic substrates such as FIG. 27, and registering them at an angle to one another. FIG. 28 shows the pattern of the first exposure from a patterned phase shift mask blank made from the generic substrate of FIG. 27, and FIG. 29 shows the pattern of the second exposure. The resultant exposure pattern is shown in FIG. 30.

Preferred embodiments for generic substrates are shown in FIGS. 31–33. The phase shift masks available from substrates such as FIGS. 31–33 would allow unexposed photoresist lines parallel, perpendicular, and at 45° to one another. Other angles are available using patterns such as FIGS. 7–9, 27, and 31–33 with differing angles.

Figure 34:
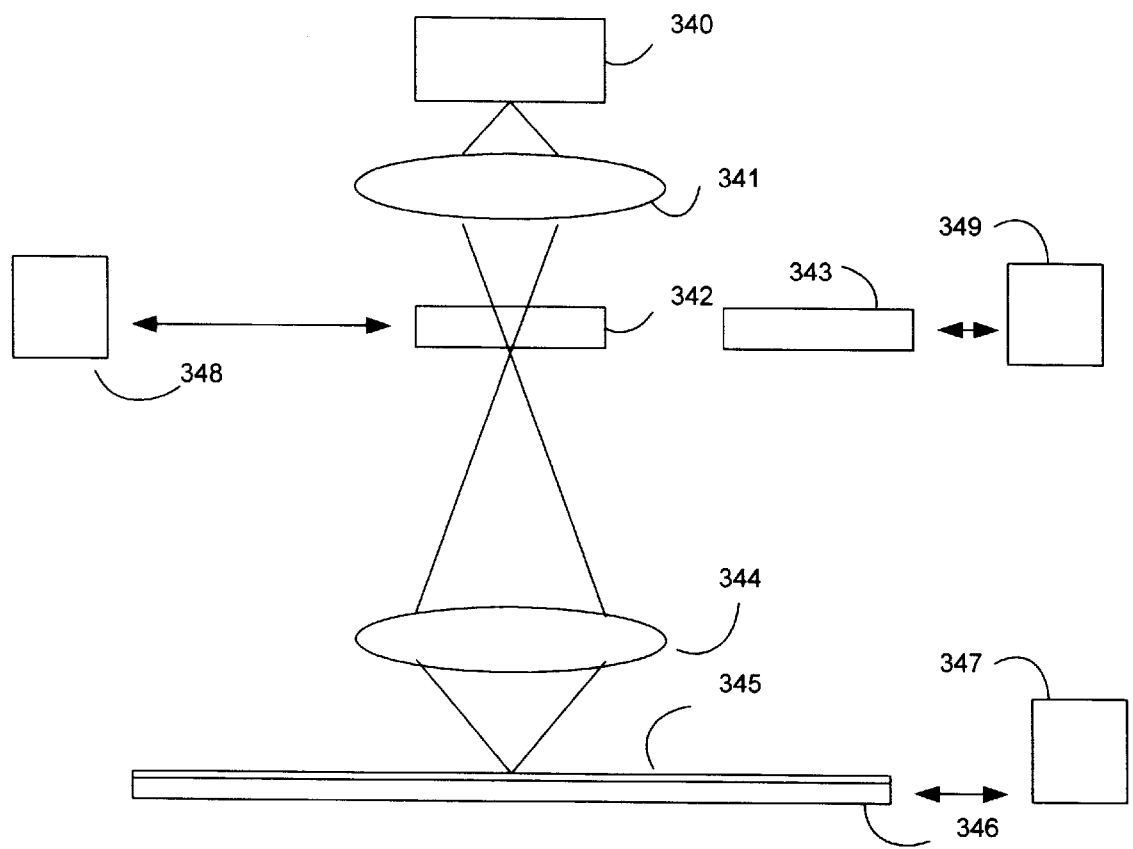
FIG. 34 shows sketch of the system of the invention.

FIG. 34 shows a sketch of the system of the invention. Radiation from a source of radiation 340 is focused on the strong phase shift mask of the invention 342 by an optical system 341. The strong phase shifting mask of the invention is introduced into place and moved relatively to the optical system by means 348. A second mask 343 is shown ready to be introduced into place by means 349. Means 344 focuses radiation transmitted through the strong phase shift mask on to the photoresist 345 covering a wafer 346. Means 347 is shown for translating and adjusting wafer 346 with respect to mask 342.

Generic masks are most preferably formed in one or more arrays covering substantially all the area of the mask, and a family of generic masks would have matching arrays, each array having the same pitch between features as others of the same family. Devices produced by such patterned generic mask ordered arrays are characterized by having features where the displacement in one dimension from one device feature to the next is an integral multiple of $\delta$, where $\delta$ is determined by the pitch of the generic substrate and the magnification of the exposure tool, and $\delta$ is larger than $\lambda/3$, where $\lambda$ is the wavelength of light used to expose the photoresist to make the features. A Fourier or wavelet transform of an image of such features is characterized if by at least one strong narrow peak indicating the pitch of the features and the dimensions of the features. Such dimensions are typically less than 150 nm. Such devices are well known logic and memory semiconductor devices, as well as micromechanical devices and combinations of micromechanical devices with logic and memory formed on a single substrate using well known semiconductor lithographic technology. Such micromechanical devices include but are not limited to motors, valves, actuators, and measurement instruments and tools.

Patents and publications referred to above are hereby incorporated by reference.

Obviously, many modifications and variations of the present invention are possible in light of the above teachings. It is therefore to be understood that, within the scope of the appended claims, the invention may be practiced otherwise than as specifically described.

I claim:

1. A strong phase shifting mask for lithography, the strong phase shifting mask comprising:
a generic substrate having a first surface and a second surface, the first surface comprising:
a first very large plurality of flat first areas for producing a first phase of light interacting with the first surface;
a second very large plurality of flat second areas for producing a second phase of light interacting with the first surface; wherein the wavefront of light interacting with the first surface at and near contiguous boundaries of the first and second areas suffers a strong phase shift, and wherein the contiguous boundaries of the first and second areas form one or more ordered arrays over substantially the entire area of the strong phase shift mask; and
a film attached to the first surface, the film opaque to the light interacting with the first surface.

2. The strong phase shifting mask of claim 1, wherein the opaque film is patterned to contain a large plurality of apertures for transmitting the light, at least some of the apertures allowing light to interact with the first surface on adjacent sides of a plurality of boundaries of a first area and a second area.

3. The strong phase shifting mask of claim 2, wherein the opaque film is patterned to cover substantially all of the plurality of boundaries between the adjacent sides.

4. The strong phase shifting mask of claim 2, wherein a plurality of the first and a plurality of the second areas are completely covered with the opaque film.

5. The strong phase shifting mask of claim 2, wherein the first areas are rectangular areas and wherein the corners of the first areas are covered with the opaque film.

6. The strong phase shifting mask of claim 1, wherein the opaque film is continuous, whereby a generic strong phase shifting mask blank suitable for further personalization is formed.

7. The strong phase shifting mask of claim 1, wherein the first areas are sunk below the second areas in the first surface of the substrate.

8. The strong phase shifting mask of claim 7, wherein the first areas are formed by etching.

9. The strong phase shifting mask of claim 7, wherein the first areas are formed by stamping.

10. The strong phase shifting mask of claim 7, wherein the first areas are formed by injection molding.

11. The strong phase shifting mask of claim 7, wherein the second areas are formed by deposition of material on the first surface.

12. The strong phase shifting mask of claim 1, wherein the substrate comprises a bottom base supporting a top phase shift layer, the top surface of the phase shift layer forming the first surface of the substrate.

13. The strong phase shifting mask of claim 1, wherein substrate is transparent to the light.

14. The strong phase shifting mask of claim 1, wherein the first surface substantially reflects the light.

15. The strong phase shifting mask of claim 14, wherein light has wavelength shorter than 160 nm.

16. The strong phase shifting mask of claim 15, wherein light has wavelength shorter than 100 nm.

17. A method of exposing a photoresist as a step in manufacturing a device, comprising:
forming an image of a patterned strong phase shifting first mask on the photoresist, wherein light of a wavelength $\lambda$ is used to form the image, wherein the patterned strong phase shifting mask comprises:
a generic substrate, the generic substrate having a first surface and a second surface, wherein the first surface has a first very large plurality of first areas for producing a first phase of light interacting with the first surface, and wherein the first surface has a second very large plurality of second areas for producing a second phase of light interacting with the first surface; and wherein the contiguous boundaries of the first and second areas form one or more ordered arrays over substantially the entire area of the patterned strong phase shifting mask;
a film attached to the first surface, the film opaque to the light interacting with the first surface, wherein the opaque film is patterned to contain a large plurality of apertures for transmitting the light, at least some of the apertures allowing light to interact with the first surface on adjacent sides of a plurality of boundaries of a first area and a second area, and wherein a plurality of the first and the second areas are completely covered with the opaque film; and
forming an image of a second mask other than a strong phase shifting mask on the photoresist, wherein the image of the second mask exposes features complementary to features exposed by the first mask.

18. The device formed using the method of claim 17, wherein device features form one or more ordered arrays over substantially an entire surface of the device.

19. The device formed using the method of claim 17, wherein device features corresponding to unexposed photoresist on at least one masking level form one or more ordered arrays over substantially an entire surface of the device, said ordered arrays being defined by a constant minimum displacement $\delta$ larger than $\lambda/3$, where the displacement from one device feature to the next is an integral multiple of $\delta$.

20. The method of claim 17, wherein substantially all of the plurality of boundaries are covered with the opaque film, whereby the width of the unexposed areas of the image of the plurality of boundaries is determined in part by the width of the opaque film covering the plurality of boundaries.

21. A system for exposing a photoresist, comprising:
a means for forming an image of a patterned strong phase shift mask on the photoresist, wherein the patterned strong phase shifting mask comprises:
a generic substrate, the generic substrate having a first surface and a second surface, wherein the first surface has a first very large plurality of first areas for producing a first phase of light interacting with the first surface, and wherein the first surface has a second very large plurality of second areas for producing a second phase of light interacting with the first surface; and wherein the contiguous boundaries of the first and second areas form one or more ordered arrays over substantially the entire area of the patterned strong phase shifting mask;
a film attached to the first surface, the film opaque to the light interacting with the first surface, wherein the opaque film is patterned to contain a large plurality of apertures for transmitting the light, at least some of the apertures allowing light to interact with the first surface on adjacent sides of a plurality of boundaries of a first area and a second area, and wherein a plurality of the first and the second areas are completely covered with the opaque film;

a means for aligning the strong phase shift mask with respect to a mark fixed with respect to the photoresist;

a means for aligning a second patterned mask other than the strong phase shift mask with respect to a mark fixed with respect to the photoresist; and a means for forming an image of the second mask on the photoresist.

22. A method for designing a device, comprising:

a) recording characteristic locations of device features manufacturable using strong phase shift photoresist exposure technology and patterning a continuous opaque film covering a first generic substrate for a strong phase shift mask, wherein a generic substrate comprises:

a substrate having a first surface and a second surface, wherein the first surface has a first very large plurality of first areas for producing a first phase of light interacting with the first surface, and wherein the first surface has a second very large plurality of second areas for producing a second phase of light interacting with the first surface; and wherein the contiguous boundaries of the first and second areas form one or more ordered arrays over substantially the entire area of the patterned strong phase shifting mask;

and wherein patterning the continuous opaque film comprises opening a large plurality of apertures in the film, the film attached to the first surface, wherein at least some of the apertures allow light to interact with the first surface on adjacent sides of a plurality of boundaries of a first area and a second area, and wherein a plurality of the first and the second areas are completely covered with the opaque film; and b) choosing which of the characteristic locations to use for the device features.

23. The method of claim 22, further comprising;

c) designing a mask other than a strong phase shifting mask complementary to the choice of locations chosen in step b).

24. The device formed using the method of claim 23, wherein device features form one or more ordered arrays over substantially an entire surface of the device.

25. The method of claim 22, further comprising;

c) choosing the width of the characteristic features.

26. The method of claim 25, further comprising;

d) designing a mask other than a strong phase shifting mask complementary to the choice of locations chosen in step b).

27. The method of claim 22, further comprising;

c) choosing the dimensions of the device features.

28. The method of claim 22, further comprising;

c) recording characteristic locations of device features manufacturable using strong phase shift photoresist exposure technology and patterning a continuous opaque film covering a second generic substrate for a strong phase shift mask; and d) choosing which of the characteristic locations common to both the first and the second generic substrates to use for the device locations.

* * * * *